(12) United States Patent
Khang et al.

(10) Patent No.: US 7,696,507 B2
(45) Date of Patent: Apr. 13, 2010

(54) STORAGE NODES, PHASE CHANGE MEMORY DEVICES, AND METHODS OF MANUFACTURING THE SAME

(75) Inventors: Yoon-ho Khang, Yongin-si (KR); Ki-joon Kim, Yongin-si (KR); Dong-seok Suh, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 172 days.

(21) Appl. No.: 11/907,844

(22) Filed: Oct. 18, 2007

(65) Prior Publication Data

US 2008/0093591 A1 Apr. 24, 2008

(30) Foreign Application Priority Data

Oct. 18, 2006 (KR) ............... 10-2006-0101570

(51) Int. Cl.
*H01L 47/00* (2006.01)
(52) U.S. Cl. ............... 257/4; 257/368; 257/E31.029; 365/145; 365/175; 438/131
(58) Field of Classification Search ............. 257/2, 257/4, 213, 288, 295, 368, E31.029; 438/3, 438/131, 197; 365/145, 175
See application file for complete search history.

(56) References Cited

U.S. PATENT DOCUMENTS 6,670,628 B2 * 12/2003 Lee et al. ............... 257/4
7,067,837 B2 * 6/2006 Hwang et al. ............... 257/3

* cited by examiner

*Primary Examiner*—Evan Pert
*Assistant Examiner*—Scott R Wilson
(74) *Attorney, Agent, or Firm*—Harness, Dickey & Pierce, P.L.C.

(57) ABSTRACT

A storage node may include a bottom electrode contact layer, a phase change layer connected to the bottom electrode contact layer, and a top electrode layer connected to the phase change layer. The bottom electrode contact layer may protrude toward the phase change layer. A phase change memory device may include a switching device and the storage node. The switching device may be connected to the bottom electrode contact layer. A method of manufacturing the storage node may include forming a via hole in an insulating interlayer, at least partially filling the via hole to form a bottom electrode contact layer, protruding the bottom electrode contact layer from the via hole, and forming a phase change layer that covers the bottom electrode contact layer. A method of manufacturing a phase change memory device may include forming the switching device on a substrate and manufacturing the storage node.

26 Claims, 9 Drawing Sheets

STORAGE NODES, PHASE CHANGE MEMORY DEVICES, AND METHODS OF MANUFACTURING THE SAME

PRIORITY STATEMENT

This application claims priority from Korean Patent Application No. 10-2006-0101570, filed on Oct. 18, 2006, in the Korean Intellectual Property Office (KIPO), the entire contents of which are incorporated herein by reference.

BACKGROUND

1. Field

Example embodiments relate to storage nodes, semiconductor memory devices, methods of manufacturing the storage nodes, and methods of manufacturing the semiconductor memory devices. Example embodiments also relate to storage nodes and phase change memory devices having an increased contact area between a bottom electrode contact layer and a phase change layer and methods of manufacturing the storage nodes and phase change memory devices.

2. Description of Related Art

Semiconductor memory devices typically include a switching device such as a transistor and a storage node electrically connected to the switching device. A phase change memory device is characterized by a phase change layer included in the storage node. A resistance of the phase change layer changes according to a state of the phase change layer (i.e., either a crystalline state or an amorphous state). Data can be recorded using this phenomenon by changing the phase change layer from the crystalline state to the amorphous state, or vice versa. Data can be read by measuring the resistance of the phase change layer.

For example, a phase change material may switch between a crystalline state and an amorphous state with changes in temperature. The crystalline or amorphous state of the phase change material may be reversible. Thus, the phase change material may change from the crystalline state to the amorphous state, or from the amorphous state to the crystalline state. The resistance of the phase change material in the crystalline state, for example, may be lower than the resistance of the phase change material in the amorphous state.

FIG. 1 is a cross-sectional view of a storage node of a conventional phase change memory device.

Referring to FIG. 1, a via hole 12 is formed in an insulating interlayer 10, and the via hole 12 is filled with a bottom electrode contact layer 14. The bottom electrode contact layer 14 is connected to a transistor (not shown) that is disposed under the storage node.

The bottom electrode contact layer 14 is formed using an electrode material layer to fill in the via hole 12 in the insulating interlayer 10 and then by planarizing a surface of the electrode material layer until a surface of the insulating interlayer 10 is exposed.

A phase change layer 16 covering the bottom electrode contact layer 14 is formed on the insulating interlayer 10. A top electrode 18 is formed on the phase change layer 16, and a top electrode contact layer 20 is formed on the top electrode 18.

In the above-described conventional phase change memory device illustrated in FIG. 1, when writing and reading are repeated, contact between the phase change layer 16 and the bottom electrode contact layer 14 may become poor because the phase change layer 16 and/or the bottom electrode contact layer 14 become exfoliated. Thus, the resistance of the phase change memory device increases and/or the current through the storage node is unstable, which makes it difficult to create state changes in the phase change layer. Accordingly, the writing and/or reading of information may become almost impossible.

SUMMARY

Example embodiments may provide phase change memory devices having increased contact area between a bottom electrode contact layer and a phase change layer, that may reduce or minimize contact defects between a bottom electrode contact layer and a phase change layer during repeated writing operations.

Example embodiments also may provide methods of manufacturing the phase change memory devices.

According to an example embodiment, a storage node may include a bottom electrode contact layer, a phase change layer electrically connected to the bottom electrode contact layer, and a top electrode layer electrically connected to the phase change layer. A first portion of the bottom electrode contact layer may protrude toward the phase change layer.

According to another example embodiment, a phase change memory device may include a switching device and a storage node. The storage node may include a bottom electrode contact layer, a phase change layer electrically connected to the bottom electrode contact layer, and a top electrode layer electrically connected to the phase change layer. A first portion of the bottom electrode contact layer may protrude toward the phase change layer. The switching device may be electrically connected to the bottom electrode contact layer.

According to yet another example embodiment, a method of manufacturing a storage node may include forming a via hole in an insulating interlayer, at least partially filling the via hole to form a bottom electrode contact layer, protruding a first portion of the bottom electrode contact layer from the via hole, and forming a phase change layer that covers the first portion of the bottom electrode contact layer. The phase change layer may be electrically connected to the bottom electrode contact layer.

According to still another example embodiment, a method of manufacturing a phase change memory device may include forming a switching device on a substrate, forming a via hole in an insulating interlayer, at least partially filling the via hole to form a bottom electrode contact layer, protruding a first portion of the bottom electrode contact layer from the via hole, and forming a phase change layer that covers the first portion of the bottom electrode contact layer. The phase change layer may be electrically connected to the bottom electrode contact layer. The switching device may be electrically connected to the bottom electrode contact layer.

BRIEF DESCRIPTION OF THE DRAWINGS

The above and/or other aspects and advantages will become more apparent and more readily appreciated from the following detailed description of example embodiments taken in conjunction with the accompanying drawings, in which.

DETAILED DESCRIPTION OF EXAMPLE EMBODIMENTS

Figure 1:
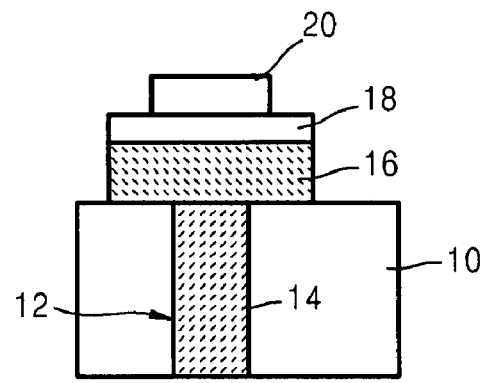
FIG. 1 is a cross-sectional view of a storage node of a conventional phase change memory device.

Example embodiments will now be described more fully with reference to the accompanying drawings. Embodiments, however, may be embodied in many different forms and should not be construed as being limited to example embodiments set forth herein. Rather, these example embodiments are provided so that this disclosure will be thorough and complete, and will fully convey the scope to those skilled in the art. In the drawings, the thicknesses of layers and regions may be exaggerated for clarity.

It will be understood that when a component is referred to as being "on," "connected to," "electrically connected to," or "coupled to" another component, it may be directly on, connected to, electrically connected to, or coupled to the other component or intervening components may be present. In contrast, when a component is referred to as being "directly on," "directly connected to," "directly electrically connected to," or "directly coupled to" another component, there are no intervening components present. As used herein, the term "and/or" includes any and all combinations of one or more of the associated listed items.

It will be understood that although the terms first, second, third, etc., may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. Thus, a first element, component, region, layer, or section discussed below could be termed a second element, component, region, layer, or section without departing from the teachings of example embodiments.

Spatially relative terms, such as "beneath," "below," "lower," "above," "upper," and the like may be used herein for ease of description to describe the relationship of one component and/or feature to another component and/or feature, or other component(s) and/or feature(s), as illustrated in the drawings. It will be understood that the spatially relative terms are intended to encompass different orientations of the device in use or operation in addition to the orientation depicted in the figures.

The terminology used herein is for the purpose of describing particular example embodiments only and is not intended to be limiting. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of stated features, integers, steps, operations, elements, and/or components, but do not preclude the presence or addition of one or more other features, integers, steps, operations, elements, and/or components.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

Reference will now be made to example embodiments that may be illustrated in the accompanying drawings, wherein like reference numerals may refer to the like components throughout.

Figure 2:
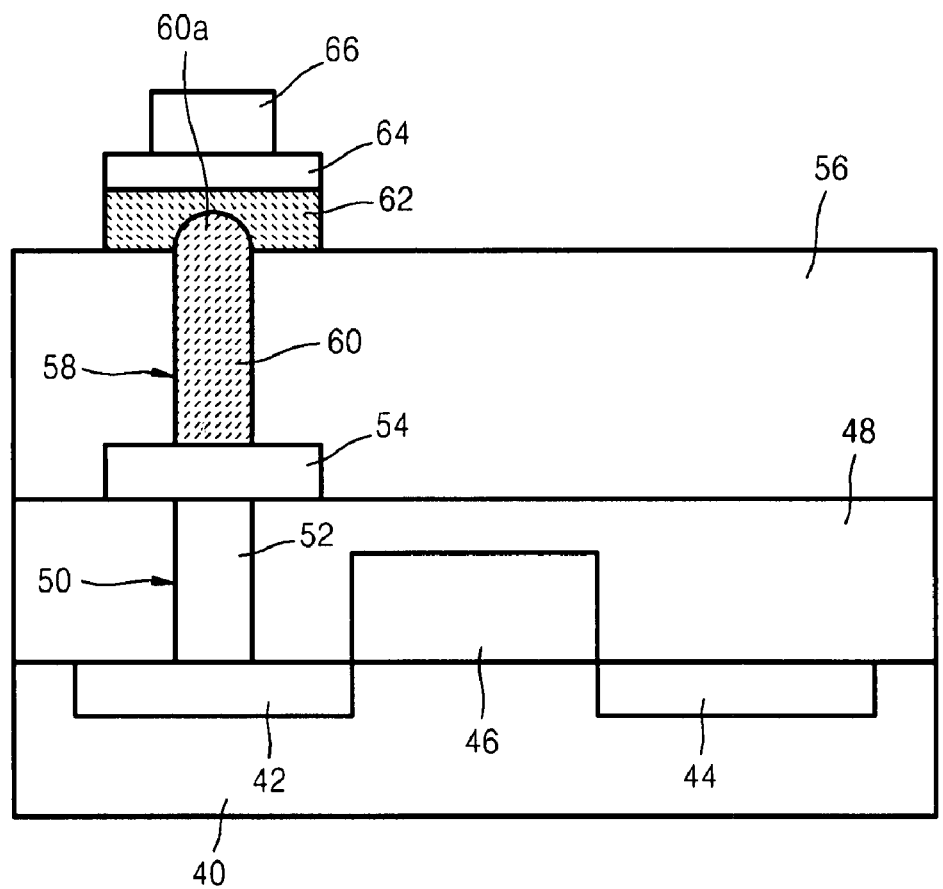
FIG. 2 is a cross-sectional view of a phase change memory device according to an example embodiment.

First, a phase change memory device according to an example embodiment will be described. FIG. 2 is a cross-sectional view of a phase change memory device according to an example embodiment.

Referring to FIG. 2, first impurity region 42 and second impurity region 44 may be formed in a substrate 40, with an interval between them. The size of the interval may or may not be predetermined. The first impurity region 42 and/or the second impurity region 44 may be doped with impurities having an opposite conductivity type to that of a material doped in the substrate 40. One of the first impurity region 42 and the second impurity region 44 may be a source region, and the other may be a drain region. A gate stack 46 including a gate electrode may be formed on the substrate 40 between the first impurity region 42 and the second impurity region 44. The first impurity region 42, the second impurity region 44, and the gate stack 46 may constitute a transistor as a switching device. Also, a diode or other device may be used as the switching device instead of the transistor. A first insulating interlayer 48 that may cover the transistor may be formed on the substrate 40. A contact hole 50, exposing the first impurity region 42, may be formed in the first insulating interlayer 48, and the contact hole 50 may be at least partially filled with a conductive plug 52. A bottom electrode 54, covering the conductive plug 52, may be formed on the first insulating interlayer 48. A second insulating interlayer 56, covering the bottom electrode 54, may be formed on the first interlayer insulating layer 48. A via hole 58, exposing an upper surface of the bottom electrode 54, may be formed in the second insulating interlayer 56. The via hole 58 may be at least partially filled with a bottom electrode contact layer 60. A space (not shown) may be further formed between the bottom electrode contact layer 60 and the second insulating interlayer 56 in the via hole 58. One of the reasons that the space may be formed in the via hole 58 is to reduce the loss of heat generated in the bottom electrode contact layer 60. The bottom electrode contact layer 60 may at least partially fill the via hole 58 and/or a portion of the bottom electrode contact layer 60 may protrude over the via hole 58. Thus, the upper portion of the bottom electrode contact layer 60 may be higher than the upper surface of the second insulating interlayer 56.

A protrusion portion 60*a* of the bottom electrode contact layer 60 may have any number of shapes. For example, the protrusion portion 60*a* may have a regular shape, such as a cube or a portion of a sphere. The protrusion portion 60*a* may have an irregular shape. The protrusion portion 60*a* may exhibit symmetry (i.e., symmetry in reflection and/or rotation). The symmetry may exist in one or more directions. The protrusion portion 60*a* may have similar or different dimensions in one or more directions. The protrusion portion 60*a* may have sharp and/or rounded edges, or no edges at all. The protrusion portion 60*a* may include flat and/or curved surfaces. The protrusion portion 60a may include one or more joined and/or separated subportions.

According to example embodiments, the bottom electrode contact layer 60 may be partially or completely eliminated and/or the via hole 58 may be at least partially filled with the phase change layer 62 as shown, for example, in one or more of FIGS. 10-13. According to example embodiments, if the bottom electrode contact layer 60 is partially or completely eliminated, the top electrode layer 64 may be at least partially formed in the second insulating interlayer 56 as shown, for example, in FIG. 11. According to example embodiments, whether or not the bottom electrode contact layer 60 is partially or completely eliminated, the bottom electrode 54 may be at least partially formed in the first insulating interlayer 48 as shown, for example, in FIG. 13.

Figure 14:
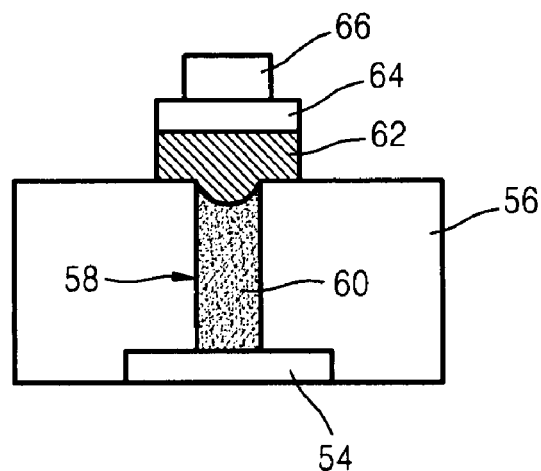
FIGS. 14-17 are cross-sectional views of portions of a phase change memory device according to example embodiments.
Figure 15:
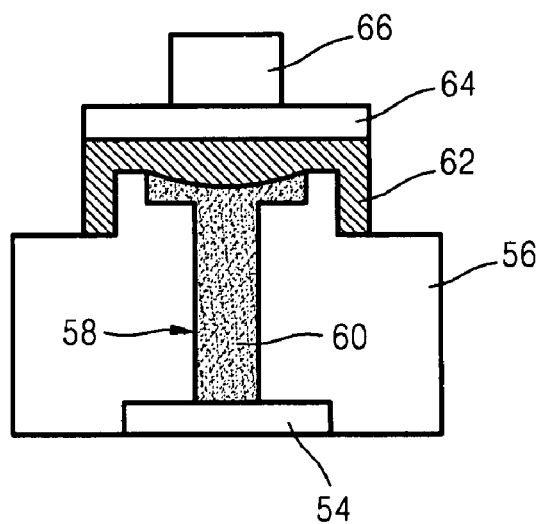
Figure 16:
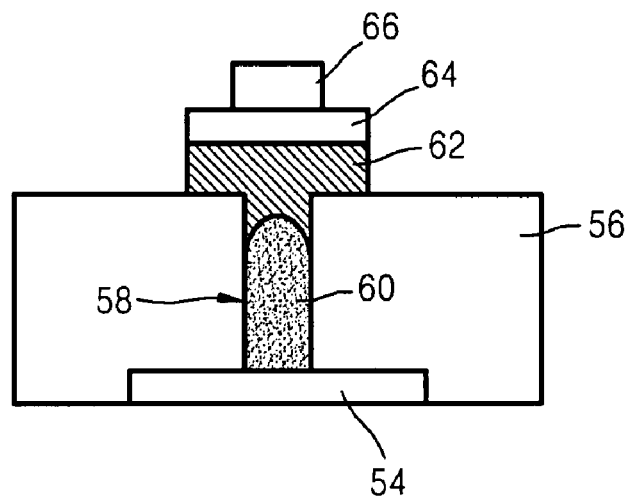
Figure 17:
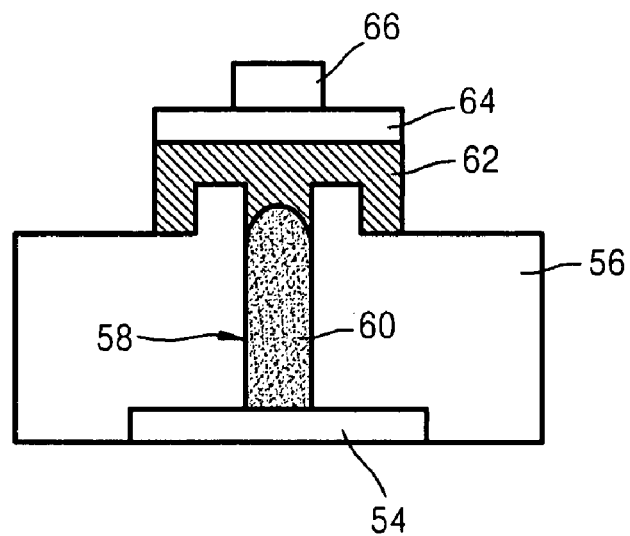

According to example embodiments, the phase change layer 62 may protrude toward the bottom electrode contact layer 60 as shown, for example, in one or both of FIGS. 14 and 15. According to example embodiments, the bottom electrode contact layer 60 may protrude toward the phase change layer 62, but may not protrude past the second insulating interlayer 56 as shown, for example, in one or both of FIGS. 16 and 17.

According to example embodiments, a phase change memory device may combine, for example, two or more of the features of FIGS. 10-17. According to example embodiments, the top electrode layer 64 and the top electrode contact layer 66 may be combined.

Figure 3:
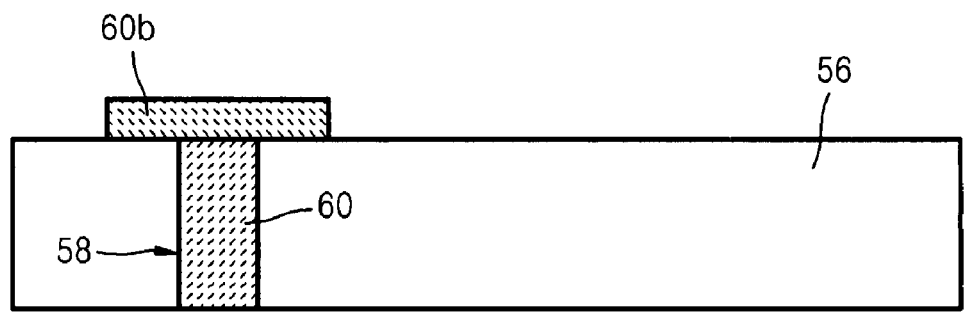
FIG. 3 is a cross-sectional view illustrating a modified example of the protrusion of the bottom electrode contact layer in the phase change memory device of FIG. 2, according to an example embodiment.

FIG. 3 is a cross-sectional view illustrating a modified example of the protrusion of the bottom electrode contact layer 60 in the phase change memory device of FIG. 2, according to an example embodiment. The bottom electrode contact layer 60 may protrude over the second insulating interlayer 56 around the bottom electrode contact layer 60, as illustrated in FIG. 3, after at least partially filling the via hole 58. The upper surface of an extended portion 60b of the bottom electrode contact layer 60 protruding over the surface of the second insulating interlayer 56 may be flat, for example. The extended portion 60b, for example, may be in the form of a plate. However, the extended portion 60b may have any number of shapes. For example, the extended portion 60b may have a regular shape, such as a cube or a portion of a sphere. The extended portion 60b may have an irregular shape. The extended portion 60b may exhibit symmetry (i.e., symmetry in reflection and/or rotation). The symmetry may exist in one or more directions. The extended portion 60b may have similar or different dimensions in one or more directions. The extended portion 60b may have sharp and/or rounded edges, or no edges at all. The extended portion 60b may include flat and/or curved surfaces. The extended portion 60b may include one or more joined and/or separated subportions.

Referring again to FIG. 2, a phase change layer 62 covering the protrusion portion 60a (or the extended portion 60b) of the bottom electrode contact layer 60 may be formed on the second insulating interlayer 56. The phase change layer 62 may include, for example, GeSbTe (GST) and/or one or more phase change materials other than GST. The phase change layer 62 layer may include, for example, one or both of $Ge_2Sb_2Te_5$ and $GeTe$—$Sb_2Te_3$.

The phase change layer 62 may include one or more chalcogenic materials (i.e., GST). For example, the phase change layer 62 may include one or more chalcogenic alloys (i.e., antimony-selenium (Sb—Se), antimony-tellurium (Sb—Te), arsenic-antimony-tellurium (As—Sb—Te), germanium-bismuth-tellurium (Ge—Bi—Te), germanium-antimony-selenium (Ge—Sb—Se), germanium-antimony-tellurium (Ge—Sb—Te), indium-antimony-selenium (In—Sb—Se), indium-antimony-tellurium (In—Sb—Te), selenium-antimony-tellurium (Se—Sb—Te), tin-antimony-tellurium (Sn—Sb—Te), silver-arsenic-antimony-tellurium (Ag—As—Sb—Te), arsenic-germanium-antimony-tellurium (As—Ge—Sb—Te), gold-arsenic-antimony-tellurium (Au—As—Sb—Te), gold-indium-antimony-tellurium (Au—In—Sb—Te), germanium-arsenic-antimony-tellurium (Ge—As—Sb—Te), nitrogen-germanium-antimony-tellurium (N—Ge—Sb—Te), tin-arsenic-antimony-tellurium (Sn—As—Sb—Te), tin-indium-antimony-tellurium (Sn—In—Sb—Te), silver-indium-antimony-selenium-tellurium (Ag—In—Sb—Se—Te), and other suitable chalcogenic alloys). In addition or in the alternative, the phase change layer 62 may include, for example, one or more group VA element-antimony-tellurium compounds (i.e., tantalum-antimony-tellurium (Ta—Sb—Te), niobium-antimony-tellurium (Nb—Sb—Te), vanadium-antimony-tellurium (V—Sb—Te), and other suitable compounds) and/or may include one or more group VA element-antimony-selenium compounds (i.e., tantalum-antimony-selenium (Ta—Sb—Se), niobium-antimony-selenium (Nb—Sb—Se), vanadium-antimony-selenium (V—Sb—Se), and other suitable compounds). In addition or in the alternative, the phase change layer 62 may include, for example, one or more group VIA element-antimony-tellurium compounds (i.e., tungsten-antimony-tellurium (W—Sb—Te), molybdenum-antimony-tellurium (Mo—Sb—Te), chromium-antimony-tellurium (Cr—Sb—Te) and other suitable compounds) and/or may include one or more group VIA element-antimony-selenium compounds (i.e., tungsten-antimony-selenium (W—Sb—Se), molybdenum-antimony-selenium (Mo—Sb—Se), chromium-antimony-selenium (Cr—Sb—Se) and other suitable compounds).

The phase change layer 62 may include one or more ternary phase change chalcogenic alloys, but the phase change layer 62 also may include one or more binary phase change chalcogenic alloys and/or one or more quaternary phase change chalcogenic alloys. The binary phase change chalcogenic alloys may include, for example, one or more of Ga—Sb, Ge—Sb, In—Sb, In—Se, $Sb_2$—$Te_3$, and Ge—Te. The quaternary phase change chalcogenic alloys may include, for example, one or more of Ag—In—Sb—Te, (Ge—Sn)—Sb—Te, Ge—Sb—(Se—Te), and $Te_{81}$—$Ge_{15}$—$Sb_2$—$S_2$.

In addition or in the alternative, the phase change layer 62 may include one or more transition metal oxides having two or more resistance states. For example, the phase change layer 62 may be include one or more of NiO, $TiO_2$, HfO, $Nb_2O_5$, ZnO, $WO_3$, CoO, and PCMO ($Pr_xCa_{(1-x)}MnO_3$).

A top electrode layer 64 may be formed on the phase change layer 62 and/or a top electrode contact layer 66 may be formed on the top electrode layer 64.

Hereinafter, a method of manufacturing a phase change memory device according to an example embodiment will be described. FIGS. 4 through 8 are cross-sectional views illustrating a method of manufacturing the phase change memory device of FIG. 2, according to an example embodiment.

Figure 4:
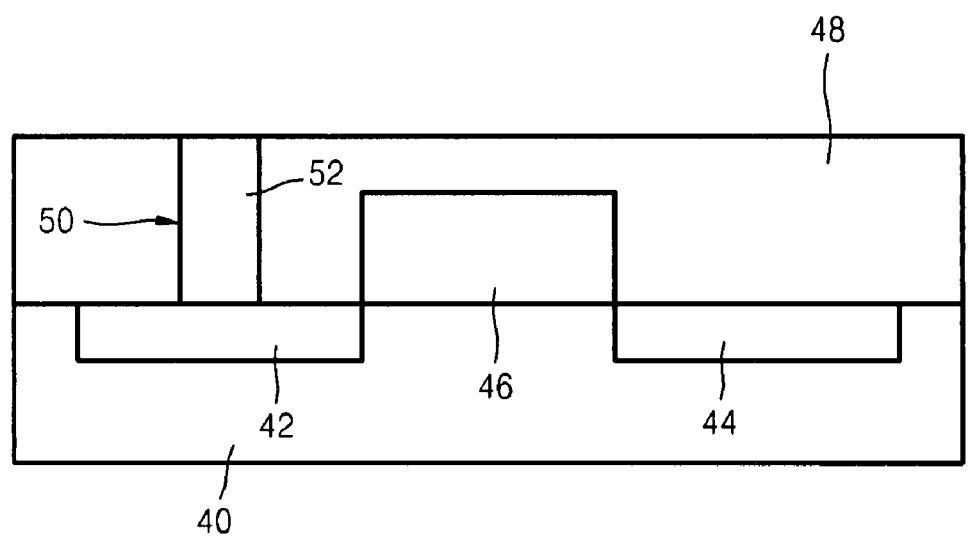
FIGS. 4 through 8 are cross-sectional views illustrating a method of manufacturing the phase change memory device of FIG. 2, according to an example embodiment.

Referring to FIG. 4, a gate stack 46 may be formed on a region of a substrate 40. The region may or may not be predetermined. The gate stack 46 may include a gate insulating layer and/or a gate electrode. Conductive impurities may be injected into the substrate 40, between a field oxide layer (not shown) defining an active region and the gate stack 46, to form the first impurity region 42 and/or the second impurity region 44. The first impurity region 42 may be used as a source region and the second impurity region 44 may be used as a drain region, or vice versa. Conductive impurities injected into the first impurity region 42 and/or the second impurity region 44 may be opposite in conductivity to that of the conductive impurities doped into the substrate 40. The first impurity region 42 and/or the second impurity region 44 may be formed in various shape(s). The first impurity region 42, the second impurity region 44, and the gate stack 46 may constitute, for example, a semiconductor transistor.

Then the first insulating interlayer 48 covering the transistor may be formed on the substrate 40. The contact hole 50, exposing the first impurity region 42, may be formed in the first insulating interlayer 48. However, example embodiments are not limited thereto and the contact hole 50 may be formed in a portion of the first insulating interlayer 48 to expose the second impurity region 44, instead of the first impurity region 42. The contact hole 50 may be at least partially filled with a conductive plug 52.

Figure 5:
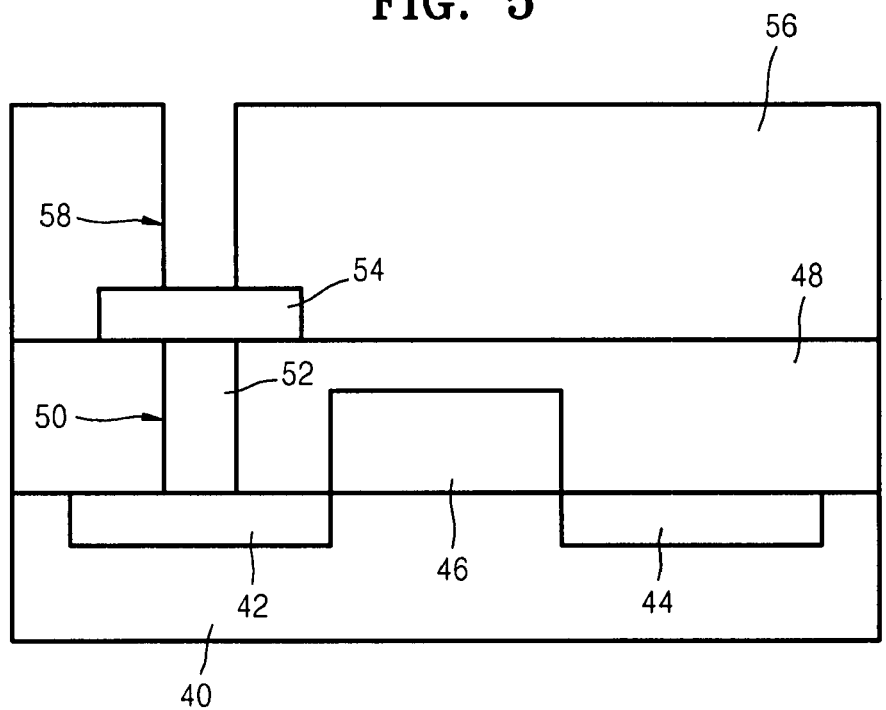

Referring to FIG. 5, the bottom electrode 54, covering an exposed upper surface of the conductive plug 52, may be formed on the first insulating interlayer 48. The second insulating interlayer 56, covering the bottom electrode 54, may be formed on the first insulating interlayer 48. The second insulating interlayer 56 may be, for example, a silicon oxide layer. The second insulating interlayer 56 and the first insulating interlayer 48 may be formed of the same or different material. The via hole 58, exposing an upper surface of the bottom electrode 54, may be formed in the second insulating interlayer 56.

Figure 6:
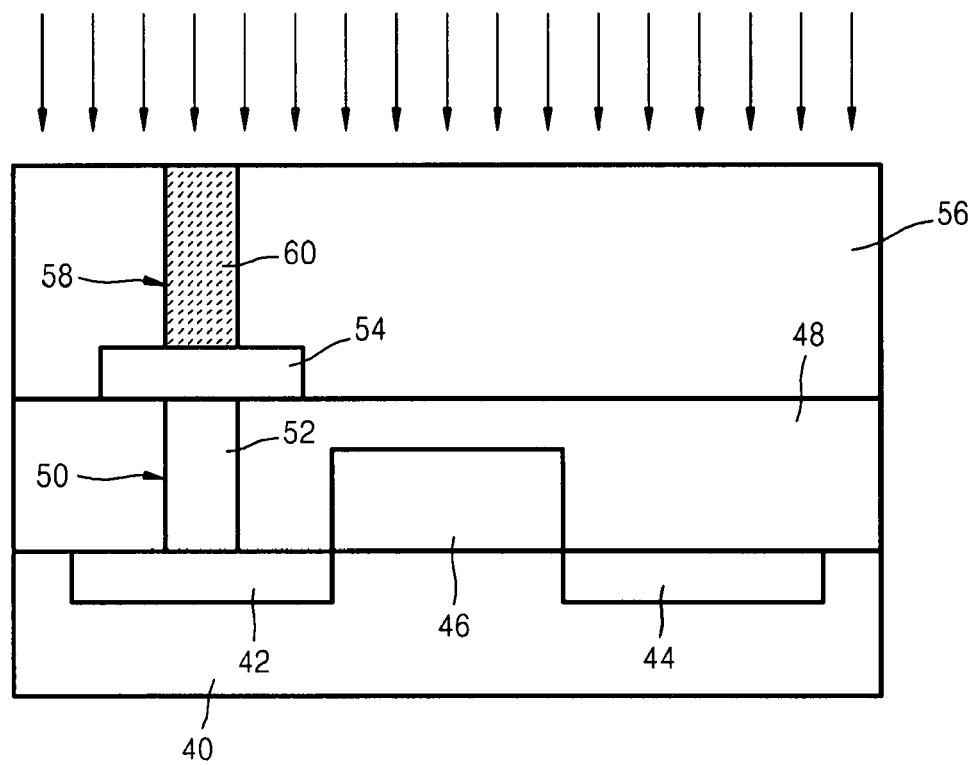

Referring to FIG. 6, the via hole 58 may be at least partially filled with the bottom electrode contact layer 60. After the via hole 58 is at least partially filled with the bottom electrode contact layer 60, an upper surface of the second insulating interlayer 56 and/or an upper surface of the bottom electrode contact layer 60 may be etched using a dry-etching method, wherein the etching rate with respect to the second insulating interlayer 56 may be higher than that with respect to the bottom electrode contact layer 60. Thus, an etching gas satisfying the above condition (i.e., argon gas), may be used for the above dry-etching method.

Figure 7:
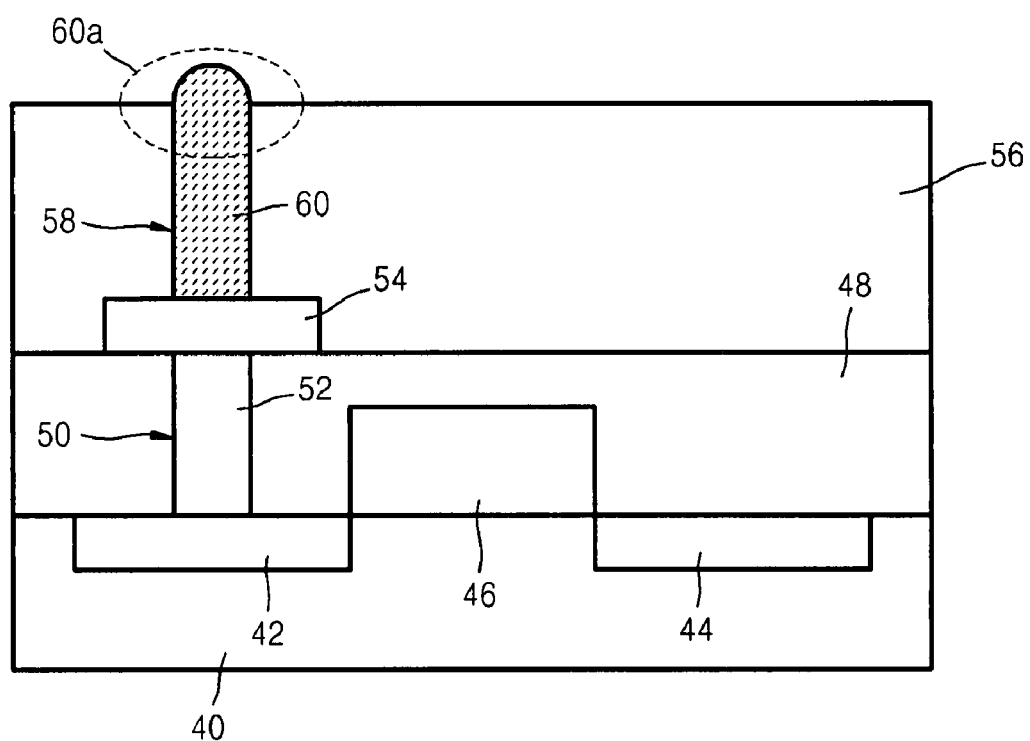

As the result of etching the second insulating interlayer 56 and/or the bottom electrode contact layer 60, an upper surface of the second insulating interlayer 56 may become lower than the upper end of the bottom electrode contact layer 60, as illustrated in FIG. 7. Thus, a protrusion portion 60a of the bottom electrode contact layer 60 may protrude over the surface of the second insulating interlayer 56.

Figure 8:
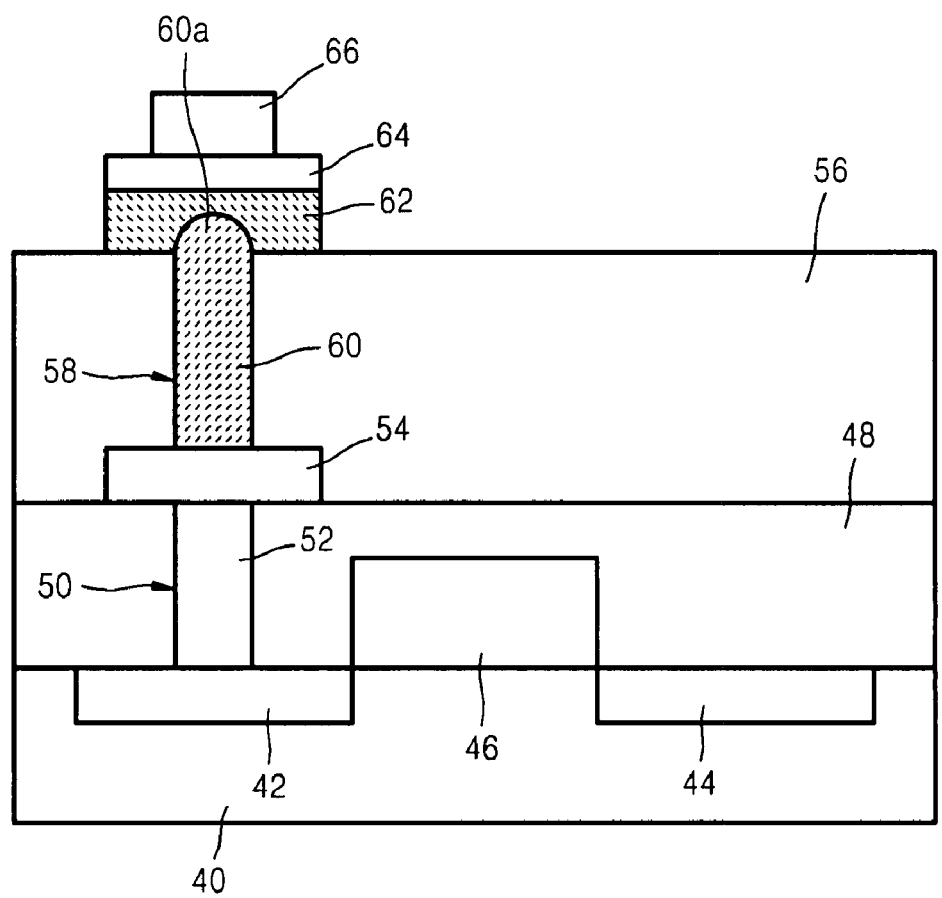

Referring to FIG. 8, a phase change layer 62, covering the protrusion portion 60a of the bottom electrode contact layer 60, may be formed on the second insulating interlayer 56. Thus, due to the protrusion portion 60a, the contact surface area between the bottom electrode contact layer 60 and the phase change layer 62 may become significantly greater as compared to a case where the bottom electrode contact layer 60 does not have a portion protruding over the upper surface of the second insulating interlayer 56.

As a result, the probability of contact defects between the bottom electrode contact layer 60 and the phase change layer 62 may be very low. And when contact defects do occur, they may be limited to an identifiable area, that may or may not be predetermined.

The phase change layer 62 may include, for example, GST and/or one or more phase change materials other than GST. A top electrode layer 64 may be formed on the phase change layer 62 and/or a top electrode contact layer 66 may be formed on the top electrode layer 64.

In addition or in the alternative, etching of the second insulating interlayer 56 and/or the bottom electrode contact layer 60 may be performed using a wet-etching method. An etchant used for the wet-etching method may also preferably satisfy the above-described etching condition. For, hydrofluoric acid (HF) may be used.

In addition or in the alternative, instead of etching the second insulating interlayer 56 and/or the bottom electrode contact layer 60, a selective growth method may be used. For example, in FIG. 6, the via hole 58 may be at least partially filled with the bottom electrode contact layer 60, and then the bottom electrode contact layer 60 may be grown using a selective growth method, such as an epitaxial growth method. Here, the growth speed of the bottom electrode contact layer 60 may be different in vertical and horizontal directions by adjusting the growth conditions, such as the source material(s) supplied for the growth of the bottom electrode contact layer 60, the temperature(s), and/or the pressure(s). That is, the vertical and horizontal growth rates of the bottom electrode contact layer 60 may be different. The bottom electrode contact layer 60 may be protruded over the second insulating interlayer 56 around the via hole 58, as illustrated in FIG. 3. In this situation, the horizontal growth rate may be greater than, equal to, or less than the vertical growth rate. The volume and/or surface area of an extended portion 60b of the bottom electrode contact layer 60 protruding over the second insulating interlayer 56 may be controlled by controlling the growth conditions. While obtaining the extended portion 60b of the bottom electrode contact layer 60, the upper surface of the second insulating interlayer 56, except the extended portion 60b, may be covered with a mask (not shown). After the extended portion 60b is formed, the mask may be removed. Then a resultant obtained using the selective growth method and the second insulating interlayer 56 may be etched using the above-mentioned dry-etching method, wet-etching method, or dry-etching method and wet-etching method.

In addition or in the alternative, the bottom electrode contact layer 60 at least partially filling the via hole 58 of FIG. 6 may be formed using the bottom electrode contact layer 60 on the second insulating interlayer 56 to at least partially fill the via hole 58, and then planarizing the bottom electrode contact layer 60 until the second insulating interlayer 56 is exposed. The extended portion 60b illustrated in FIG. 3 may be obtained, for example, by controlling the planarization process.

For example, the planarization process may be performed using a polishing method, such as a chemical mechanical polishing (CMP) method, and the planarization process may be stopped before an upper surface of the second insulating interlayer 56 is exposed. Thus, a portion of the bottom electrode contact layer 60 corresponding to the thickness of the extended portion 60b illustrated in FIG. 3 may be left on the upper surface of the second insulating interlayer 56. Then a mask corresponding to the extended portion 60b, for example, a photosensitive layer pattern, may be formed on the exposed portion of the bottom electrode contact layer 60 that is disposed on the upper surface of the second insulating interlayer 56. The exposed portion of the bottom electrode contact layer 60 may be etched on the upper surface of the second insulating interlayer 56, and then the mask may be removed. Thus the extended portion 60b of FIG. 3 may be formed.

Figure 9:
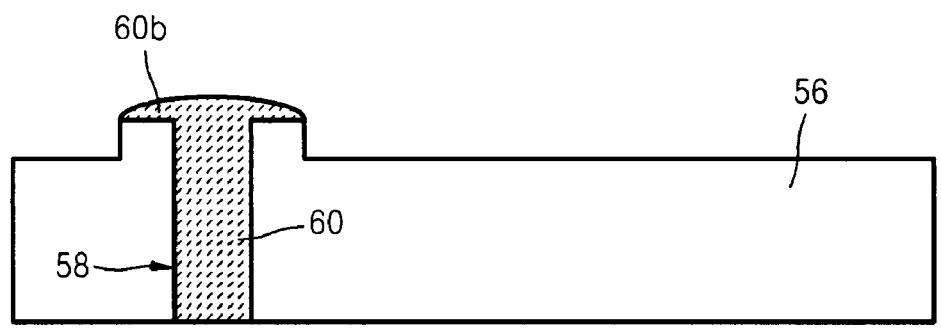
FIG. 9 is a cross-sectional view illustrating another modified example of the protrusion of the bottom electrode contact layer in the phase change memory device of FIG. 2, according to an example embodiment.
Figure 10:
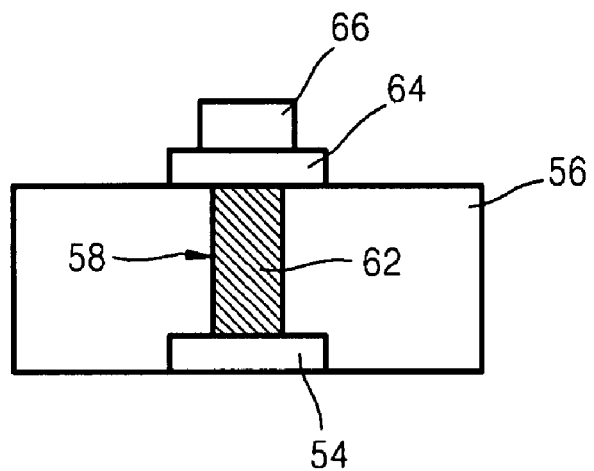
FIGS. 10-13 are cross-sectional views of portions of a phase change memory device according to example embodiments.
Figure 11:
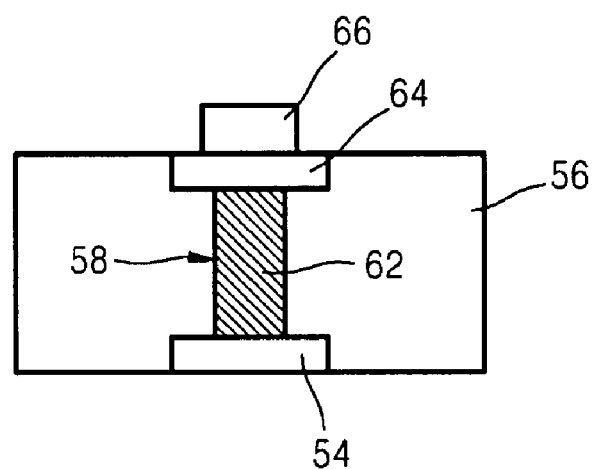
Figure 12:
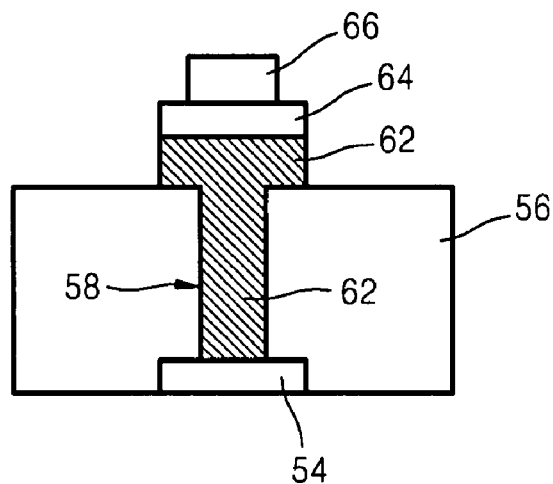
Figure 13:
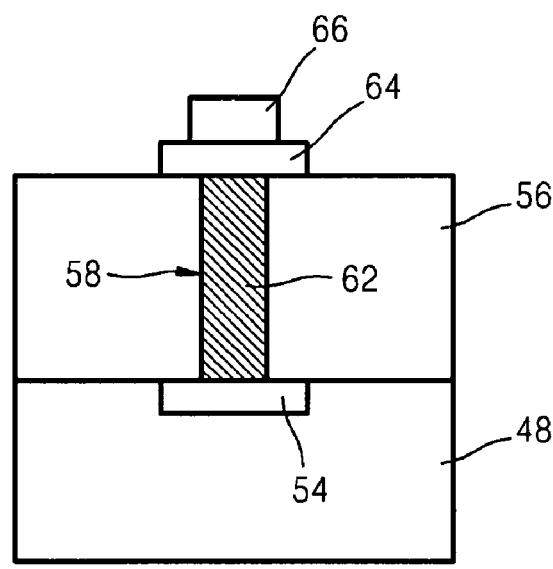

FIG. 9 is a cross-sectional view illustrating another modified example of the protrusion of the bottom electrode contact layer 60 in the phase change memory device of FIG. 2, according to an example embodiment. The extended portion 60b of the second insulating interlayer 56 and/or the bottom electrode contact layer 60 may be etched, for example, using the above-mentioned dry-etching method, wet-etching method, or dry-etching method and wet-etching method.

FIG. 9 illustrates a resultant structure, wherein the etching rate of the second insulating interlayer 56 may be higher than that of the bottom electrode contact layer 60. As described above, in the phase change memory device according to example embodiments, an upper portion of a bottom electrode contact layer may protrude outside of the via hole 58. Thus, the contact surface area between the bottom electrode contact layer 60 and the phase change layer 62 may increase. Therefore, the probability of contact defects, such as exfoliation, occurring between the bottom electrode contact layer 60 and the phase change layer 62 during repeated writing operations may be very low. Thus, the number of times that writing operations of the phase change memory device according to example embodiments may be greatly increased. Also, operating reliability of the phase change memory device according to example embodiments may be increased.

Materials other than those discussed for forming the elements of example embodiments may be suggested by those of ordinary skill in the art. Also, the bottom electrode contact layer 60 may directly contact the first impurity region 42 or the second impurity region 44. In addition, example embodiments may be applied to methods of manufacturing memory devices other than the phase change memory device.

While example embodiments have been particularly shown and described, it will be understood by those of ordinary skill in the art that various changes in form and details may be made therein without departing from the spirit and scope of the present invention as defined by the following claims.

What is claimed is:

1. A storage node, comprising:
   a bottom electrode contact layer filling a via hole;
   a phase change layer electrically connected to the bottom electrode contact layer; and
   a top electrode layer electrically connected to the phase change layer;
   wherein a first portion of the bottom electrode contact layer protrudes toward the phase change layer.

2. The storage node of claim 1, wherein the first portion of the bottom electrode contact layer extends at least partially around a second portion of the bottom electrode contact layer.

3. A phase change memory device, comprising:
   a switching device; and
   the storage node of claim 1;
   wherein the switching device is electrically connected to the bottom electrode contact layer.

4. The device of claim 3, further comprising:
   an insulating layer disposed between the switching device and the phase change layer;
   wherein the insulating layer includes a via hole.

5. The device of claim 4, wherein the bottom electrode contact layer at least partially fills the via hole.

6. The device of claim 4, wherein the bottom electrode contact layer fills the via hole.

7. The device of claim 4, wherein the first portion of the bottom electrode contact layer extends at least partially around the via hole.

8. The device of claim 3, wherein the switching device includes a transistor.

9. The device of claim 3, wherein the switching device includes a diode.

10. A method of manufacturing a storage node, the method comprising:
    forming a via hole in an insulating interlayer;
    at least partially filling the via hole to form a bottom electrode contact layer;
    protruding a first portion of the bottom electrode contact layer from the via hole; and
    forming a phase change layer that covers the first portion of the bottom electrode contact layer;
    wherein the phase change layer is electrically connected to the bottom electrode contact layer.

11. The method of claim 10, further comprising:
    forming a top electrode layer;
    wherein the top electrode layer is electrically connected to the phase change layer.

12. The method of claim 11, wherein the storage node comprises:
    the bottom electrode contact layer;
    the phase change layer; and
    the top electrode layer.

13. The method of claim 10, wherein the protruding of the first portion of the bottom electrode contact layer includes etching an upper surface of the insulating interlayer at an etching rate higher than that of the bottom electrode contact layer.

14. The method of claim 13, wherein the etching is performed using a dry-etching method, a wet-etching method, or a dry-etching method and a wet-etching method.

15. The method of claim 10, wherein protruding the first portion of the bottom electrode contact layer includes selectively growing the bottom electrode contact layer from the via hole.

16. The method of claim 15, wherein selectively growing the bottom electrode contact layer includes growing the bottom electrode contact layer differently in a vertical direction and in a horizontal direction.

17. The method of claim 15, wherein selectively growing the bottom electrode contact layer includes growing the bottom electrode contact layer at different rates in a vertical direction and in a horizontal direction.

18. The method of claim 17, wherein growing the bottom electrode contact layer at different rates includes growing the bottom electrode contact layer in the horizontal direction at a higher rate than in the vertical direction.

19. The method of claim 17, wherein growing the bottom electrode contact layer at different rates includes etching an upper surface of the insulating interlayer at an etching rate higher than that of the bottom electrode contact layer.

20. The method of claim 19, wherein the etching is performed using a dry-etching method, a wet-etching method, or a dry-etching method and a wet-etching method.

21. The method of claim 10, wherein at least partially filling the via hole comprises forming the bottom electrode contact layer on the insulating interlayer to at least partially fill the via hole, and
    wherein protruding the first portion of the bottom electrode contact layer includes:
    planarizing the bottom electrode contact layer formed on the insulating interlayer to a thickness;
    forming a mask that covers part of the planarized bottom electrode contact layer;
    removing the planarized bottom electrode contact layer not covered by the mask; and
    removing the mask.

22. The method of claim 21, further comprising:
    etching an upper surface of the insulating interlayer at an etching rate higher than that of the bottom electrode contact layer.

23. The method of claim 22, wherein the etching is performed using a dry-etching method, a wet-etching method, or a dry-etching method and a wet-etching method.

24. A method of manufacturing a phase change memory device, the method comprising:

forming a switching device on a substrate; and
manufacturing the storage node of claim 10;
wherein the switching device is electrically connected to the bottom electrode contact layer.

25. The method of claim 24, further comprising:
forming a top electrode layer;
wherein the top electrode layer is electrically connected to the phase change layer.

26. The method of claim 25, wherein the storage node comprises:
the bottom electrode contact layer;
the phase change layer; and
the top electrode layer.

* * * * *